(12) United States Patent
Lin

(10) Patent No.: US 6,350,632 B1
(45) Date of Patent: Feb. 26, 2002

(54) SEMICONDUCTOR CHIP ASSEMBLY WITH BALL BOND CONNECTION JOINT

(76) Inventor: Charles W. C. Lin, 34 Pinewood Grove, Singapore 738290 (SG)

( * ) Notice: Subject to any disclaimer, the term of this patent is extended or adjusted under 35 U.S.C. 154(b) by 0 days.

(21) Appl. No.: 09/665,928

(22) Filed: Sep. 20, 2000

(51) Int. Cl.⁷ .............................................. H01L 21/48
(52) U.S. Cl. ........................ 438/107; 438/118; 438/125
(58) Field of Search ................................ 438/106, 107, 438/118, 125

(56) References Cited

U.S. PATENT DOCUMENTS

| | | | |
|---|---|---|---|
| 4,442,967 A | 4/1984 | van de Pas et al. ........ | 228/159 |
| 4,661,192 A | 4/1987 | McShane .................... | 156/292 |
| 4,717,066 A | 1/1988 | Goldenberg et al. ........ | 228/179 |
| 4,750,666 A | 6/1988 | Neugebauer et al. ....... | 228/160 |
| 4,807,021 A | 2/1989 | Okumura ..................... | 357/75 |
| 4,925,083 A | 5/1990 | Farassat et al. ............. | 228/102 |
| 4,937,653 A | 6/1990 | Blonder et al. ............... | 357/68 |
| 4,955,523 A | 9/1990 | Calomagno et al. ........ | 228/179 |
| 4,970,571 A | 11/1990 | Yamakawa et al. ........... | 357/71 |
| 4,984,358 A | 1/1991 | Nelson ......................... | 29/830 |
| 5,014,111 A | 5/1991 | Tsuda et al. ................... | 357/68 |
| 5,060,843 A | 10/1991 | Yasuzato et al. ............ | 228/179 |
| 5,074,947 A | 12/1991 | Estes et al. ............... | 156/307.3 |
| 5,090,119 A | 2/1992 | Tsuda et al. ................... | 29/843 |
| 5,106,461 A | 4/1992 | Volfson et al. ............. | 205/125 |
| 5,116,463 A | 5/1992 | Lin et al. ..................... | 156/653 |
| 5,137,845 A | 8/1992 | Lochon et al. ............... | 437/183 |
| 5,167,992 A | 12/1992 | Lin et al. ..................... | 427/437 |
| 5,172,851 A | 12/1992 | Matsushita et al. ......... | 228/179 |
| 5,196,371 A | 3/1993 | Kulesza et al. ............. | 437/183 |
| 5,209,817 A | 5/1993 | Ahmad et al. .............. | 156/643 |
| 5,237,130 A | 8/1993 | Kulesza et al. ............. | 174/260 |
| 5,260,234 A | 11/1993 | Long ........................... | 437/203 |
| 5,261,593 A | 11/1993 | Casson et al. ......... | 228/180.22 |
| 5,275,330 A | 1/1994 | Issacs et al. ............. | 228/180.2 |
| 5,284,796 A | 2/1994 | Nakanishi et al. ........... | 437/183 |
| 5,293,067 A | 3/1994 | Thompson et al. ......... | 257/668 |
| 5,294,038 A | 3/1994 | Nakano et al. ........... | 228/179.1 |
| 5,327,010 A | 7/1994 | Uenaka et al. ............... | 257/679 |
| 5,334,804 A | 8/1994 | Love et al. .................. | 174/267 |
| 5,346,750 A | 9/1994 | Hatakeyama et al. ....... | 428/209 |
| 5,355,283 A | 10/1994 | Marrs et al. ................. | 361/760 |
| 5,358,621 A | 10/1994 | Oyama ........................ | 205/123 |
| 5,364,004 A | 11/1994 | Davidson .................... | 228/1.1 |
| 5,397,921 A | 3/1995 | Karnezos .................... | 257/779 |
| 5,407,864 A | 4/1995 | Kim ........................... | 437/203 |
| 5,424,245 A | 6/1995 | Gurtler et al. .............. | 437/183 |
| 5,438,477 A | 8/1995 | Pasch .......................... | 361/689 |

(List continued on next page.)

FOREIGN PATENT DOCUMENTS

| | | | |
|---|---|---|---|
| EP | 0 718 882 A1 | 6/1996 | ......... H01L/23/057 |
| WO | WO 97/38563 | 10/1997 | ............ H05K/1/03 |
| WO | WO 99/57762 | 11/1999 | ........... H01L/23/48 |

OTHER PUBLICATIONS

Markstein et al., "Controlling the Variables in Stencil Printing," Electronic Packaging & Production, Feb. 1997, pp. 48–56.

(List continued on next page.)

*Primary Examiner*—Vu A. Le
*Assistant Examiner*—Beth E. Owens
(74) *Attorney, Agent, or Firm*—David M. Sigmond (57) ABSTRACT

A semiconductor chip assembly includes a semiconductor chip attached to a support circuit. The support circuit includes an insulative base, a conductive trace and a through-hole that extends through the conductive trace. A ball bond connection joint in the through-hole contacts and electrically connects the conductive trace and the pad. A method of manufacturing the assembly includes mechanically attaching the chip to the support circuit such that the through-hole exposes the pad, and then forming the ball bond in the through-hole using thermocompression or thermosonic wire bonding.

60 Claims, 9 Drawing Sheets

U.S. PATENT DOCUMENTS

| | | | |
|---|---|---|---|
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 438/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/737 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,994,222 A | 11/1999 | Smith et al. | 438/689 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,037,665 A | 3/2000 | Miyazaki | 257/773 |
| 6,046,909 A | 4/2000 | Joy | 361/748 |
| 6,084,297 A | 6/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,127,204 A | 10/2000 | Isaacs et al. | 438/106 |

OTHER PUBLICATIONS

Elenius, "Choosing a Flip Chip Bumping Supplier —Technology an IC Package contractor should look for," Advanced Packaging, Mar./Apr. 1998, pp. 70–73.

Erickson, "Wafer Bumping: The Missing Link for DCA," Electronic Packaging & Production, Jul. 1998, pp. 43–46.

Kuchenmeister et al., "Film Chip Interconnection Systems Prepared By Wet Chemical Metallization," IEEE publication 0–7803–4526–6/98, Jun. 1998, 5 pages.

Ghaffarian, "Long Time BGA Assembly Reliability," Advancing Microelectronics, vol. 25, No. 6, Sep./Oct. 1998, pp. 20–23.

U.S. Application Serial No. 09/465,024, filed Dec. 16, 1999, entitled "Bumpless Flip Chip Assembly With Solder Via" 6,319,751, 11/01.

U.S. Application Serial No. 09/464,562, filed Dec. 16, 1999, entitled "Bumpless Flip Chip Assembly With Strips and Via–Fill" 6,316,830, Nov. 2001.

U.S. Application Serial No. 09/464,561, filed Dec. 16, 1999, entitled "Bumpless Flip Chip Assembly With Strips–In–Via And Plating".

SEMICONDUCTOR CHIP ASSEMBLY WITH BALL BOND CONNECTION JOINT

BACKGROUND OF THE INVENTION

1. Field of the Invention

The present invention relates generally to a semiconductor chip assembly, and more particularly to a semiconductor chip assembly in which a semiconductor chip is mechanically and electrically connected to a support circuit.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses. Finally, the solder is typically a tin-lead alloy and lead-based materials are becoming far less popular due to environmental concerns over disposing of toxic materials and leaching of toxic materials into ground water supplies.

U.S. Pat. No. 4,442,967 discloses a method of providing a raised contact portion on a microcircuit. A wire ball is formed on a wire end by applying thermal energy, the wire ball is pressed against a contact area on the microcircuit using thermocompression or thermosonic wire bonding to form a ball bond, a weakened area of the wire is created near the ball bond, and the wire is severed at the weakened area to provide a raised contact portion on the contact area. The contact portions thus obtained are relatively simple and economical compared to electroplated bumps. However, the contact portions do not yet provide an electrical connection to a support circuit. In order to make this connection, additional process steps are necessary, such as thermocompression bonding the contact portions to TAB inner leads, or disposing a conductive adhesive between the contact portions and bond sites in a flip-chip arrangement.

U.S. Pat. No. 4,661,192 discloses a method of bonding chips to support frames by providing ball bonds on chip pads using wire bonding, planarizing the ball bonds, coating the planarized ball bonds with conductive epoxy, and then registering and bonding the conductive epoxy to corresponding conductive patterns on support frames. Thus, multiple process steps are necessary to electrically connect the chips to the support frames after forming the ball bonds. In addition, care must be taken to ensure that the epoxy does not flow excessively and cause shorting between the leads.

Conductive adhesives that electrically connect pads on chips to conductive traces on support circuits are well-known in the art. As mentioned above, organic conductive adhesive bumps with conductive fillers in polymer binders have been used, but they do not normally form a metallurgical interface in the classical sense. Moisture penetration through the polymer binder may induce corrosion or oxidation of the conductive filler particles resulting in an unstable electrical connection. Furthermore, the polymer binder and the conductive filler may degrade leading to an unstable electrical connection. Thus, the conductive adhesive may have adequate mechanical strength but poor electrical characteristics.

In view of the various development stages and limitations in currently available semiconductor chip assemblies, there is a need for a semiconductor chip assembly that is cost-effective, reliable, manufacturable, provides excellent mechanical and electrical performance, and complies with stringent environmental standards.

SUMMARY OF THE INVENTION

An object of the present invention is to provide a semiconductor chip assembly with a chip and a support circuit that provides a low cost, high performance, high reliability package.

Another objective of the present invention is to provide a convenient, cost-effective method for manufacturing semiconductor chip assemblies as chip size packages, ball grid arrays or other structures.

The present invention accomplishes these objectives by providing a ball bond connection joint between the chip and the support circuit.

In accordance with one aspect of the invention, a semiconductor chip assembly includes a semiconductor chip with a conductive pad, a support circuit with an insulative base, a conductive trace and a through-hole that extends through the conductive trace, and a ball bond in the through-hole that contacts and electrically connects the conductive trace and the pad.

Preferably, the semiconductor chip assembly includes an insulative adhesive between and in contact with an upper surface of the chip and a bottom surface of the support circuit, and the ball bond extends through an opening in the adhesive.

It is also preferred that the conductive trace includes a pillar and a routing line, the pillar extends above the base and the routing line, the routing line extends below the base, and the through-hole extends through openings in the base, the routing line and the adhesive.

In accordance with another aspect of the invention, a method of manufacturing the semiconductor chip assembly includes providing the chip and the support circuit such that the through-hole exposes the pad, and then forming the ball bond in the through-hole using thermocompression or thermosonic wire bonding.

The method may include using a capillary to press a wire ball into the through-hole and onto the pad, continuing using the capillary to press and deform the wire ball into a ball bond that fills the openings in the routing line and the adhesive and contacts and forms alloys with the routing line and the pad, and then withdrawing the capillary so that the ball bond cools and forms a mushroom-shaped ball bond connection joint.

The method may also include forming the opening in the routing line, and then applying a laser etch to form the openings in the base and the adhesive. The laser etch may be applied either before or after mechanically attaching the chip to the support circuit. Furthermore, the laser etch may form a relatively large opening in the base that exposes a portion of the top surface of the routing line adjacent to the opening in the routing line so that the mushroom-shaped ball bond connection joint includes a cap that contacts the top surface portion of the routing line without contacting the base and a stem that contacts the sidewalls of the opening in the routing line and the pad.

An advantage of the present invention is that the semiconductor chip assembly need not include TAB leads or solder joints. Another advantage is that the assembly can be manufactured using conventional wire bonding equipment. Still another advantage is that the assembly can be manufactured using low temperature processes which reduces stress and improves reliability. A further advantage is that the assembly can be manufactured using well-controlled wet chemical processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

FIGS. 1A–1G and 2A–2G are cross-sectional and top views, respectively, of a method of manufacturing a semiconductor chip assembly in accordance with an embodiment of the present invention.

Figure 1A:
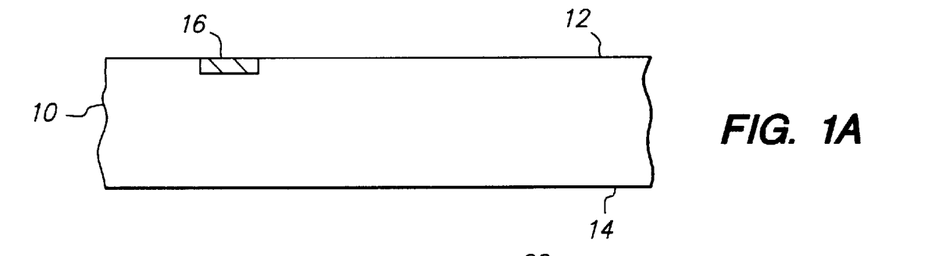
FIGS. 1A–1G are cross-sectional views showing a method of manufacturing a semiconductor chip assembly in accordance with an embodiment of the present invention.
Figure 2A:
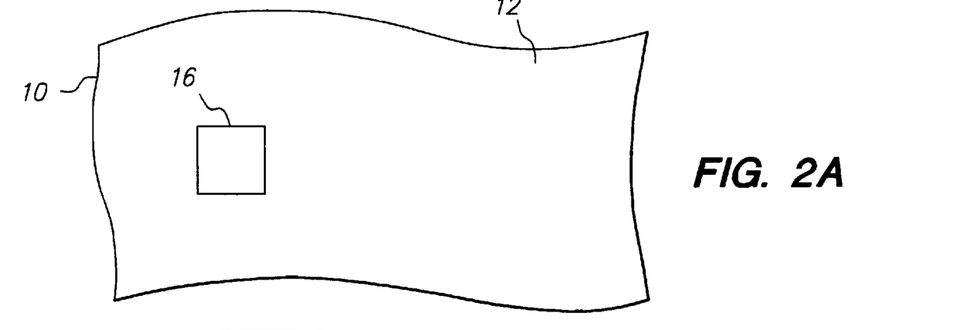
FIGS. 2A–2G are top plan views corresponding to FIGS. 1A–1G, respectively.

FIGS. 1A and 2A are cross-sectional and top views, respectively, of semiconductor chip 10 in which various transistors, circuits, interconnect lines and the like are formed (not shown). Chip 10 includes upper surface 12 and lower surface 14. Upper surface 12 includes conductive pad 16. Pad 16 is substantially aligned with the insulative housing of chip 10 so that upper surface 12 is essentially flat. Alternatively, if desired, pad 16 can extend above or be recessed below the insulative housing. Pad 16 provides a bonding site to electrically couple chip 10 with external circuitry. Thus, pad 16 can be an input/output pad or a power/ground pad. Pad 16 can have an aluminum base that serves as a surface layer, or alternatively, an aluminum base covered by a surface layer such as gold with an adhesion and/or barrier layer therebetween, depending on the nature of a connection joint that shall subsequently contact the pad. If desired, the aluminum base of pad 16 is cleaned by dipping chip 10 in a solution containing 0.05 M phosphoric acid at room temperature for 1 minute and then rinsed in distilled water before depositing the next layer on the aluminum base. Pad 16 has a length and width of 100 microns. Chip includes many other pads on upper surface 12, and only pad 16 is shown for convenience of illustration.

Figure 1B:
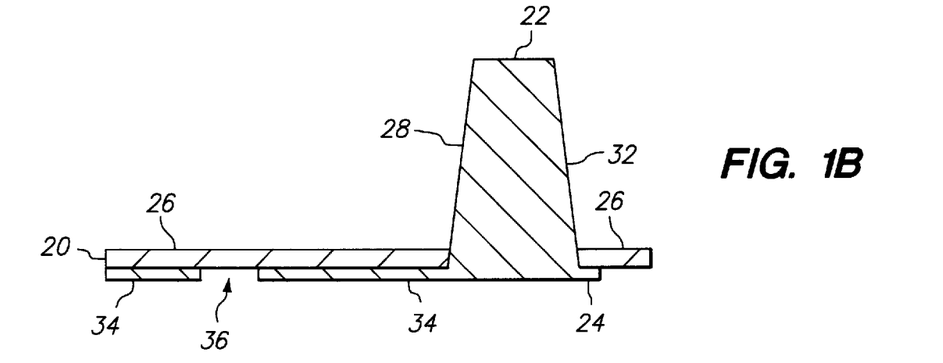
Figure 2B:
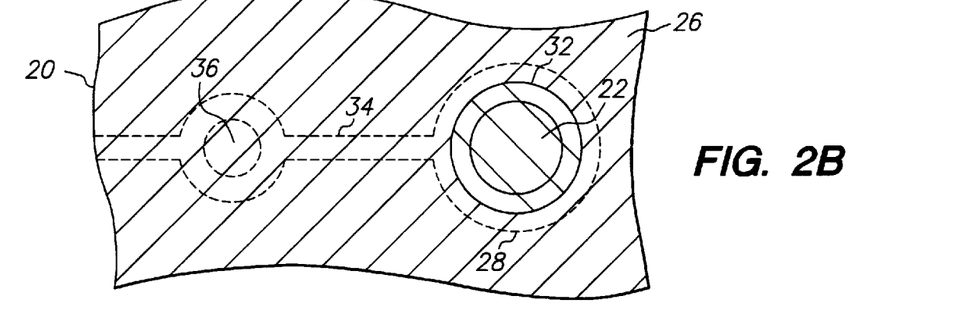

FIGS. 1B and 2B are cross-sectional and top views, respectively, of support circuit 20 which is adapted to be mechanically and electrically coupled to chip 10 to form a semiconductor chip assembly. Support circuit 20 includes top surface 22 and bottom surface 24. Support circuit 20 also includes insulative base 26 and conductive trace 28. Conductive trace 28 is embedded in base 26 and may function as a signal, power or ground layer depending on the purpose of pad 16. Conductive trace 28 includes pillar 32 and routing line 34. Pillar 32 extends above base 26. Pillar 32 also tapers inwardly with increasing height. That is, pillar 32 has a diameter that decreases with increasing height and is narrowest at its top surface. The taper provides increased mechanical strength near the top surface of base 26 which is desirable during next level assembly. Pillar 32 also has a flat top surface which facilitates next level assembly. Routing line 34 extends below base 26 and forms part of bottom surface 24. Routing line 34 includes opening 36. Thus, opening 36 extends through routing line 34 and is covered by base 26. Opening 36 is horizontally offset from pillar 32, and routing line 34 provides horizontal routing (fan-in or fan-out) between opening 36 and pillar 32.

Preferably, base 26 is composed of an epoxy compound that includes an epoxy resin and a silica filler, and conductive trace 28 is composed of copper. In addition, base 26 has a thickness of 25 microns, pillar 32 has a diameter of 300 microns that decreases with increasing height, a height of 150 microns and extends 115 microns above base 26, routing line 34 has a width of 25 microns and a thickness of 10 microns, opening 36 has a diameter of 80 microns, and the portion of routing line 34 that surrounds opening 36 has a diameter of 150 microns. Of course, other materials and dimensions are suitable.

Support circuit 20 includes other conductive traces in base 26, and only conductive trace 28 is shown for convenience of illustration. The other conductive traces each include a pillar, a routing line, and an opening that extends through the corresponding routing line and is covered by the base. In addition, the conductive traces are electrically isolated from one another by base 26 except for a plating bus and related circuitry that shall be subsequently disconnected or severed.

Support circuit 20 can be manufactured in a variety of ways. For instance, in a conventional approach, a copper foil is laminated on a disposable substrate that provides a release sheet which can be easily removed when desired, the copper foil is patterned using photolithography to form routing line 34, a solder mask is blanket deposited on routing line 34 and the substrate to form base 26, a via is formed in base 26 that extends from the top surface of base 26 to a top surface of routing line 34, pillar 32 is selectively deposited on the portion of routing line 34 exposed by the via by electroplating copper and grows upwardly to fill and extend above the via, a through-hole that includes opening 36 is formed in base 26 and routing line 34, and then the substrate is removed. A drawback to this conventional approach is the difficulty with forming pillar 32 with a suitable taper extending above base 26. Another approach is described in U.S. application Ser. No. 09/643,213, filed Aug. 22, 2000 by Charles W. C. Lin entitled "Method of Making a Support Circuit for a Semiconductor Chip Assembly" which is incorporated by reference.

Figure 1C:
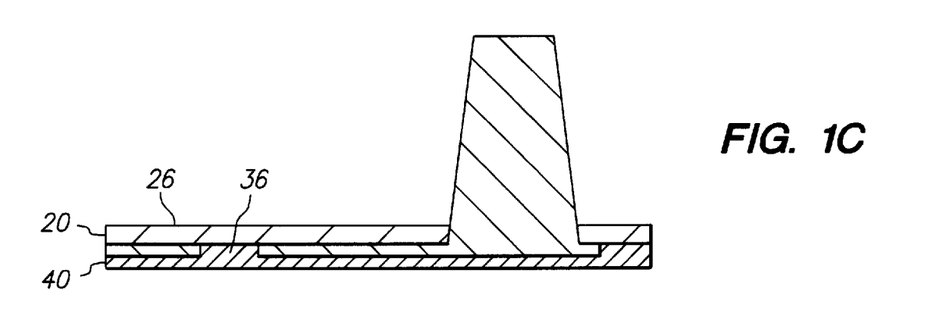
Figure 2C:
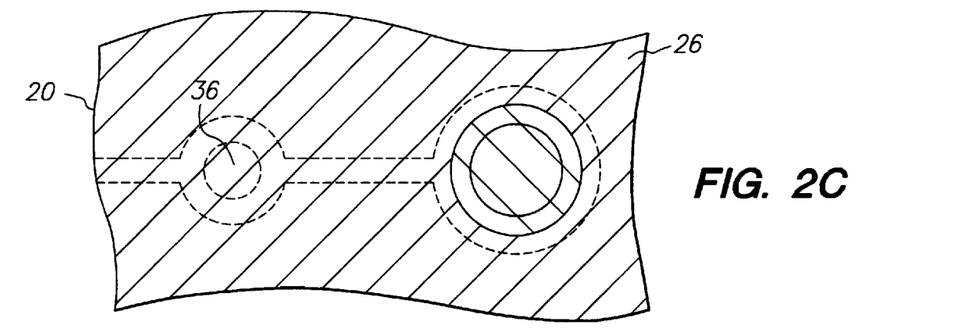

FIGS. 1C and 2C are cross-sectional and top views, respectively, of support circuit 20 and adhesive 40. Adhesive 40 is an electrical insulator disposed on bottom surface 24 of support circuit 20. Adhesive 40 is a thermoplastic polyimide film with a glass transition temperature (Tg) of 400° C. Adhesive 40 is applied to bottom surface 24 as a liquid resin such as polyamic acid that fills opening 36 and contacts base 26, and thereafter is cured. Adhesive 40 is 10 microns thick. At this stage, opening 36 is covered from above by base 26, filled with adhesive 40, and covered from below by adhesive 40.

Figure 1D:
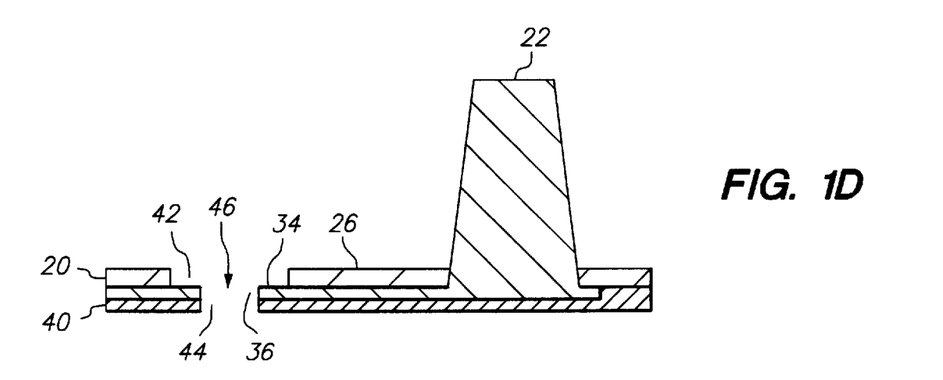
Figure 2D:
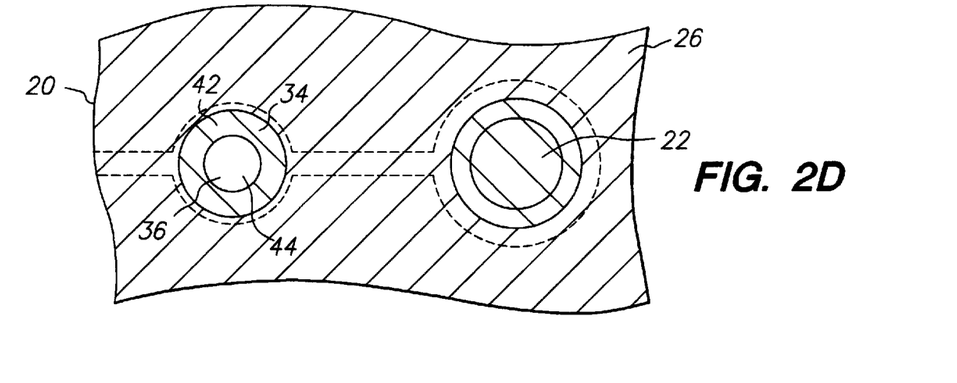

FIGS. 1D and 2D are cross-sectional and top views, respectively, of support circuit 20 and adhesive 40 after openings are formed in base 26 and adhesive 40 above and below opening 36. In particular, a portion of base 26 above opening 36 is selectively removed to form opening 42 in base 26 that exposes opening 36, the adhesive 40 in opening 36 is removed, and a portion of adhesive 40 below opening 36 is selectively removed to form opening 44 in adhesive 40. The combination of openings 36, 42 and 44 form through-hole 46 that extends through support circuit 20 and adhesive 40. Openings 42 and 44 can be provided by applying a suitable etch that is highly selective of base 26 and adhesive 40 with respect to routing line 34. The preferred etch depends on the relative thickness of base 26 and adhesive 40. Most etches exhibit little or no selectivity of base 26 with respect to adhesive 40. That is, base 26 and adhesive 40 etch at about the same rate.

In this instance, a selective laser etch is applied. A metal mask (not shown) is positioned above top surface 22 such that an opening in the metal mask is aligned with opening 36, and a laser is directed to the side of the metal mask opposite support circuit 20. Accordingly, the metal mask targets the laser at a region that surrounds and is larger than opening 36 but does not extend beyond the enlarged ring-shaped portion of routing line 34 that surrounds opening 36. The laser forms opening 42, removes whatever adhesive 40 is inside opening 36, and forms opening 44. This laser etch technique is commonly known as projection laser ablation and is analogous to how a photolithographic stepper selectively exposes a photoresist layer to light. Alternatively, if desired, laser direct write (without a mask) can be employed. Opening 42 has a diameter of 130 microns and exposes opening 36 as well as a ring-shaped top surface portion of routing line 34 adjacent to opening 36 that was previously covered by base 26. The laser does not deform or remove an appreciable amount of routing line 34. In fact, routing line 34 is the only portion of support circuit 20 that provides an etch stop for the laser. As a result, the laser essentially provides an extension or pattern transfer of opening 36 through adhesive 40. Although opening 42 has a larger diameter than that of opening 36, opening 44 has an essentially identical diameter to that of opening 36. Moreover, openings 36, 42 and 44 are aligned with one another.

Figure 1E:
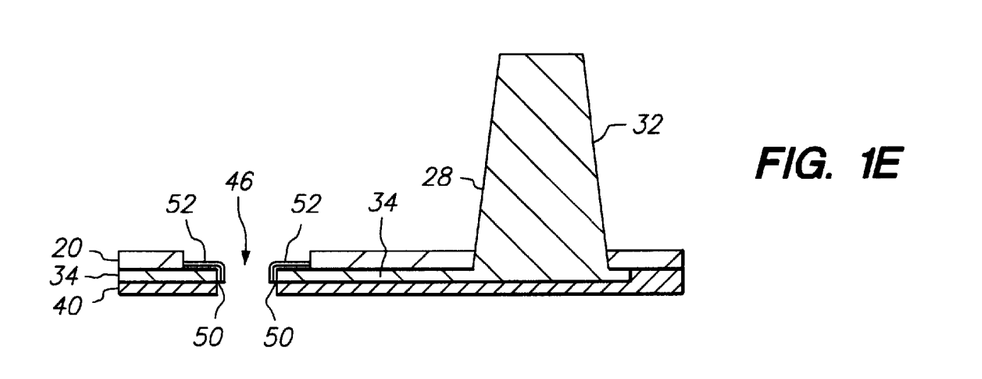
Figure 2E:
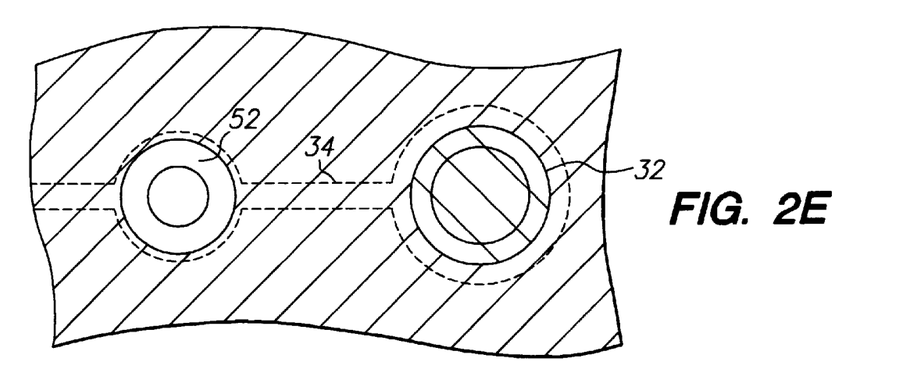

FIGS. 1E and 2E are cross-sectional and top views, respectively, of support circuit 20 and adhesive 40 after selectively electroplating metal on routing line 34 in through-hole 46. Conductive trace 28 is connected to a plating bus (not shown), current is applied to the plating bus from an external power source, and support circuit 20 and adhesive 40 are submerged in an electrolytic nickel plating solution while a mask (not shown) such as a metal piece coated with an insulator covers pillar 32 and exposes through-hole 46 to the solution. As a result, electroplated nickel 50 with a thickness of 2 microns is deposited (or spot plated) on the exposed portions of routing line 34 in through-hole 46. Thereafter, support circuit 20 and adhesive 40 are removed from the electrolytic nickel plating solution and submerged in an electrolytic silver plating solution while the current is applied to the plating bus and the mask covers pillar 32 and exposes through-hole 46. As a result, electroplated silver 52 with a thickness of 3 microns is deposited (or spot plated) on electroplated nickel 50. Thereafter, support circuit 20 and adhesive 40 are removed from the electrolytic silver plating solution, the current is shut off, and the mask is removed. Accordingly, routing line 34 now includes electroplated nickel 50 and electroplated silver 52, the height of opening 36 is increased by 5 microns from 25 microns to 30 microns, and the diameter of opening 36 is narrowed by 10 microns from 80 microns to 70 microns. Electroplated silver 52 provides a contact region for routing line 34 inside through-hole 46 that is adapted to receive a gold ball bond as described below, and electroplated nickel 50 provides a barrier layer between the silver and copper portions of routing line 34 that prevents the formation of brittle silver-copper intermetallic compounds.

Figure 1F:
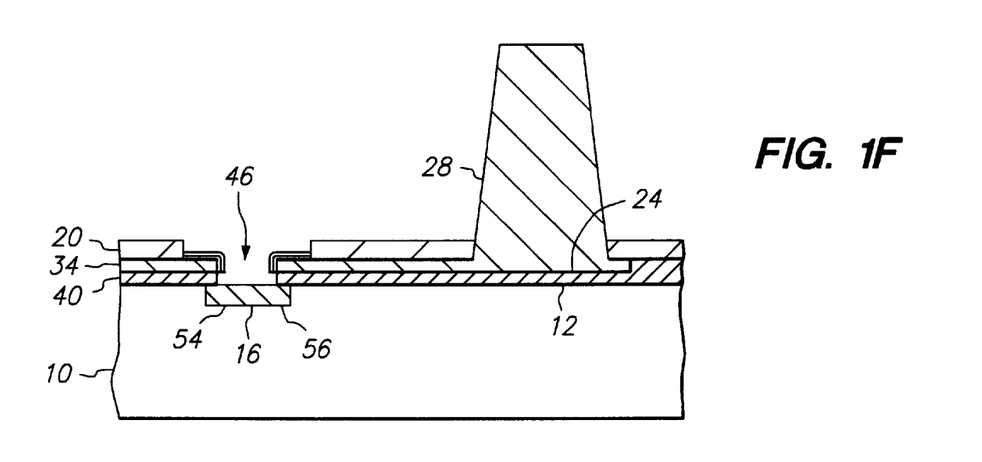
Figure 2F:
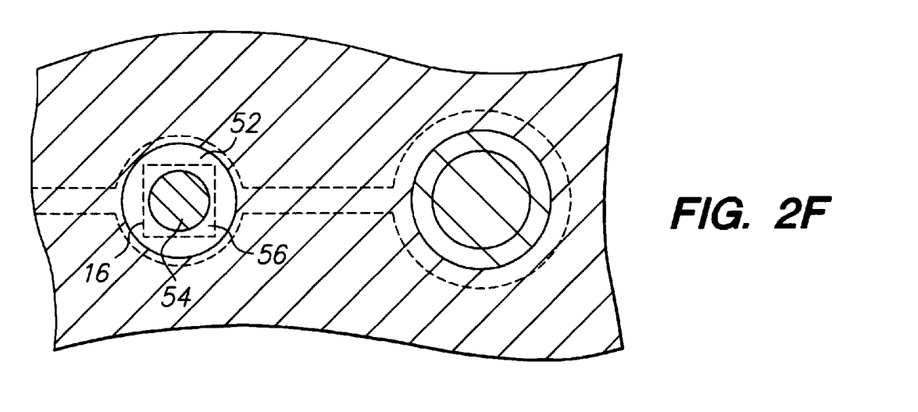

FIGS. 1F and 2F are cross-sectional and top views, respectively, of chip 10 mechanically attached to support circuit 20 by adhesive 40. Adhesive 40 is disposed between and contacts upper surface 12 of chip 10 and bottom surface 24 of support circuit 20. Thus, chip 10 and support circuit 20 do not contact one another. Preferably, adhesive 40 is sandwiched between upper surface 12 and bottom surface 24 using relatively low pressure while adhesive 40 is heated to its glass transition temperature and becomes molten. In addition, chip 10 and support circuit 20 are positioned relative to one another so that pad 16 is aligned with through-hole 46. That is, at least a portion of pad 16, and preferably a majority of pad 16, is directly beneath and exposed by through-hole 46. Since the 100 micron length and width of pad 16 exceed the 70 micron diameter of opening 36, all of pad 16 cannot be exposed by through-hole 46. Instead, central portion 54 of pad 16 is exposed by through-hole 46 and peripheral portion 56 of pad 16 is covered by adhesive 40. Pad 16 and through-hole 46 can be aligned using an automated pattern recognition system. Thereafter, adhesive 40 is cooled and solidifies to form a solid adhesive layer that is 10 microns thick and mechanically fastens chip 10 to support circuit 20. At this stage, pad 16 is exposed by through-hole 46 but is not electrically connected to conductive trace 28, which is separated from pad 16 by the thickness of adhesive 40.

Figure 1G:
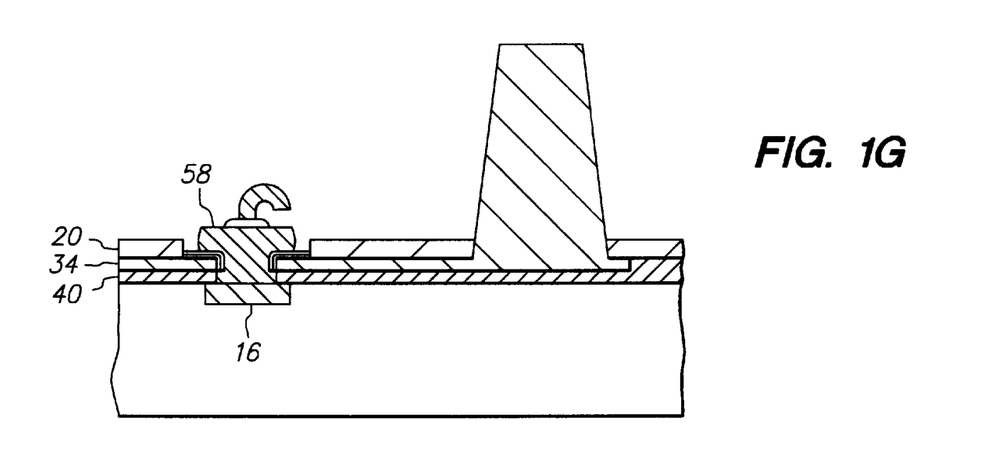
Figure 2G:
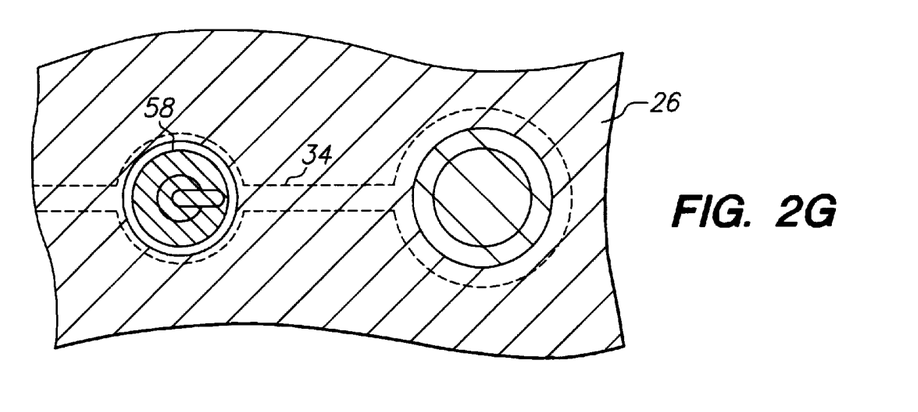

FIGS. 1G and 2G are cross-sectional and top views, respectively, of the completed assembly after ball bond connection joint 58 is formed. As is seen, ball bond connection joint 58 is formed in through-hole 46, extends through opening 44 in adhesive 40, and contacts pad 16 and routing line 34, thereby electrically connecting pad 16 and routing line 34. Ball bond connection joint 58 is composed of gold. Ball bond connection joint 58 is formed by thermosonic wire bonding, although thermocompression wire bonding can also be used. Ball bond connection joint 58 fills openings 36 and 44 and extends into opening 42 but does not contact base 26. Thus, the sidewalls of opening 42 remain exposed and devoid of metal. Moreover, ball bond connection joint 58 only contacts portions of pad 16, routing line 34 and adhesive 40 exposed by through-hole 46 and is the only electrical conductor in through-hole 46. Ball bond connection joint 58 has an exposed top surface that is not connected to anything. Ball bond connection joint 58 provides a robust, permanent electrical connection between pad 16 and routing line 34.

FIGS. 3A–3E are enlarged cross-sectional views showing a method of making ball bond connection joint 58.

Figure 3A:
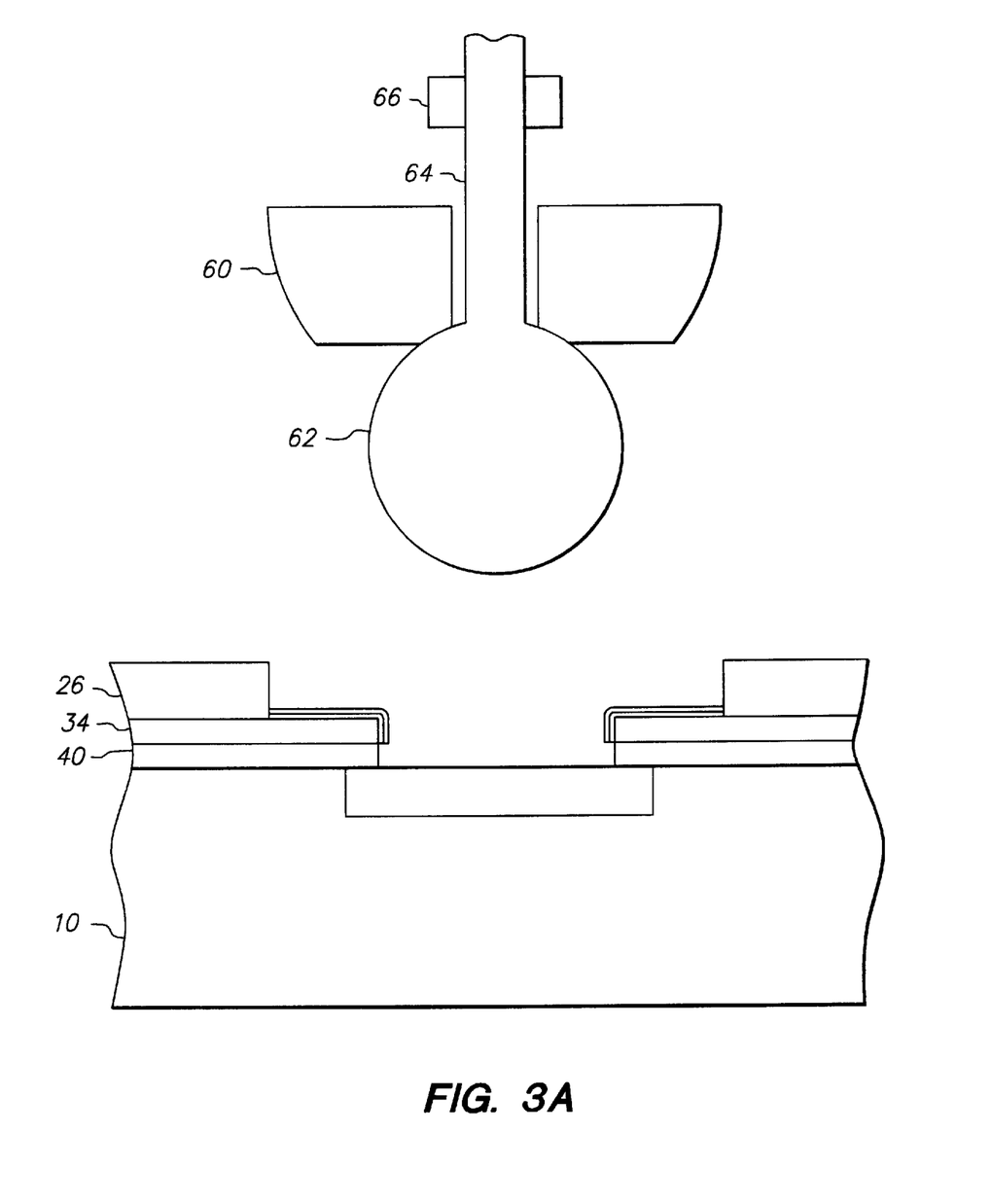
FIGS. 3A–3E are enlarged cross-sectional views showing a method of making the ball bond connection joint in FIG. 1G.

FIG. 3A shows the partially completed assembly after capillary 60 and wire ball 62 are positioned above through-hole 46. Capillary 60 is part of a conventional thermosonic wire bonding apparatus. Capillary 60 has a conical shape and can be composed of alumina, tungsten carbide, ceramic, artificial ruby or various refractory metals. Wire ball 62 is composed of gold and protrudes from the bottom of capillary 60. Wire ball 62 is formed at the end of gold wire 64 by applying thermal energy, such as electronic flame-off or a hydrogen gas flame jet, as is conventional. Wire 64 is fed from a spool (not shown) through clamp 66 and a bore in capillary 60. Clamp 66 is closed to hold wire 64 in place. Wire ball 62 has a diameter of 90 microns, and wire 64 has a diameter of 35 microns. Wire ball 62 is suitably sized so that the subsequently formed ball bond connection joint 58 shall fill openings 36 and 44 as well as partially fill opening 42. This can be demonstrated through arithmetic calculations.

Openings 36 and 44 have vertical sidewalls and circular shapes as viewed from top surface 22 of support circuit 20. Therefore, the volumes of openings 36 and 44 can be calculated as follows:

$$\text{Volume}=\pi r^2 h \tag{1}$$

where r is the radius and h is the height.

In accordance with equation (1) and the dimensions given above, the volumes of openings 36 and 44 can be calculated as follows:

$$\text{Volume (opening 36)}=\pi(70/2 \text{ microns})^2(15 \text{ microns})=58\times 10^3 \text{ cubic microns} \tag{2}$$

$$\text{Volume (opening 44)}=\pi(80/2 \text{ microns})^2(10 \text{ microns})=50\times 10^3 \text{ cubic microns} \tag{3}$$

Therefore, openings 36 and 44 have a combined volume of $108\times 10^3$ cubic microns.

Wire ball 62 has a substantially spherical shape. Therefore, the volume of wire ball 62 can be calculated as follows:

$$\text{Volume}=(4/3)\pi r^3 \tag{4}$$

where r is the radius.

Equation (4) can be solved for the radius needed equal or exceed a given volume:

$$r \geq \sqrt[3]{(3/4\pi)(\text{Volume})} \tag{5}$$

In accordance with equation (5), the radius of wire ball 62 necessary to fill openings 36 and 44 can be calculated as follows:

$$r \geq \sqrt[3]{(3/4\pi)(108\times 10^3 \text{ cubic microns})} \tag{6}$$

$r \geq 29.6$ microns

Therefore, the diameter of wire ball 62 necessary to fill openings 36 and 44 is at least 59.2 microns. Since wire ball 62 has a diameter of 90 microns, wire ball 62 is large enough to fill openings 36 and 44 and cover a portion of the top surface of routing line 34 that is exposed by opening 42 and adjacent to opening 36.

Figure 3B:
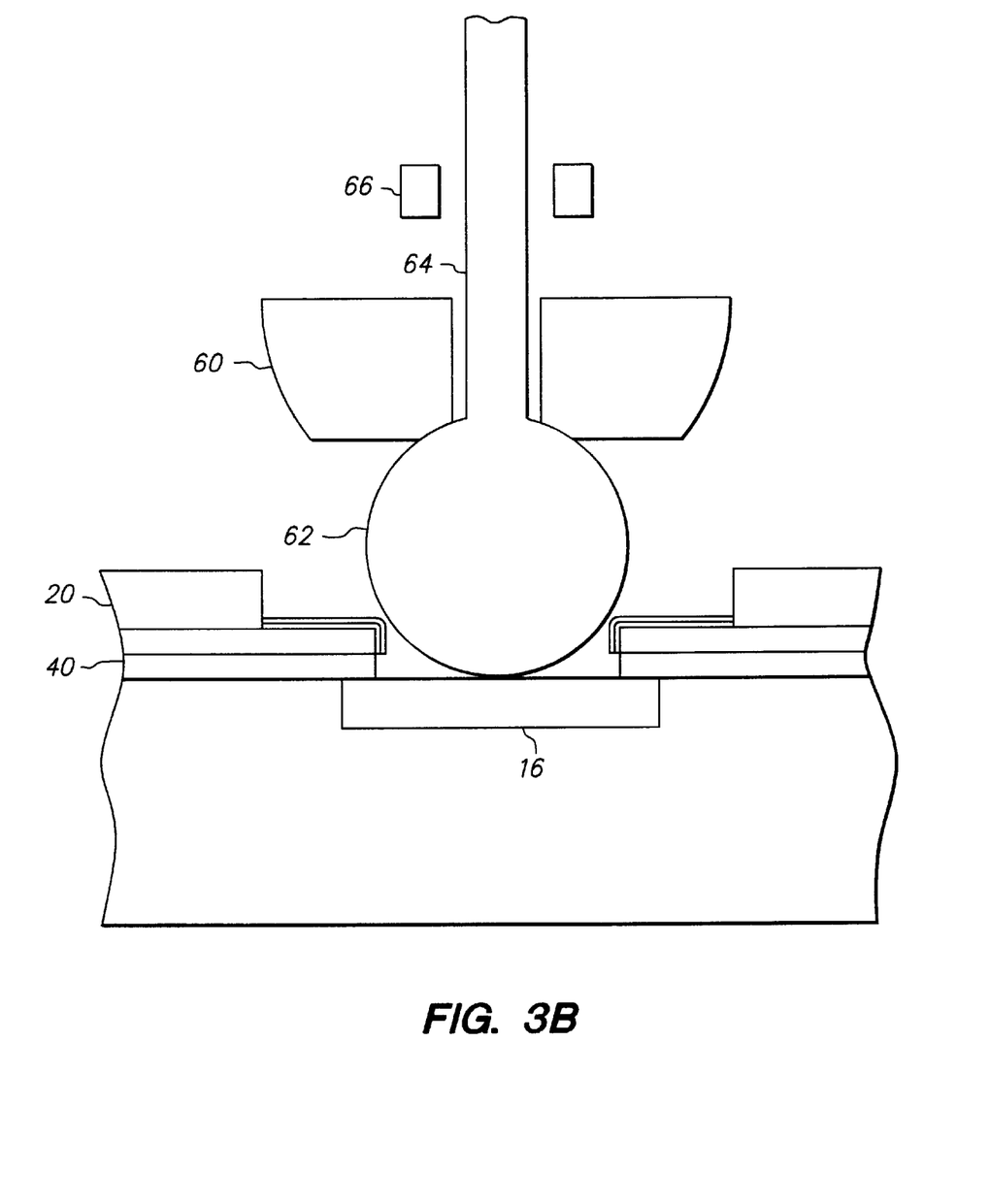

FIG. 3B shows the partially completed assembly after capillary 60 moves downward towards pad 16 such that wire ball 62 enters openings 36, 42 and 44 and contacts pad 16 without contacting base 26 or routing line 34. Since wire ball 62 has a substantially spherical shape and is centered with respect to opening 36, and opening 36 has a diameter of 70 microns and extends 25 microns above pad 16, wire ball 62 initially contacts pad 16 without contacting any portion of support circuit or adhesive 40. Clamp 66 opens before the movement begins so that wire 64 unwinds from its spool as capillary 60 moves. In addition, capillary 60 is heated to about 150 to 200° C. and provides horizontal ultrasonic oscillatory motions with a frequency of about 60 to 120 kHz. The combination of heat from capillary 60 and the recent flaming operation place wire ball 62 in a soft state which is easy to deform. However, the temperature of wire ball 62 does not reach the glass transition temperature of adhesive 40 which remains a solid adhesive film.

Figure 3C:
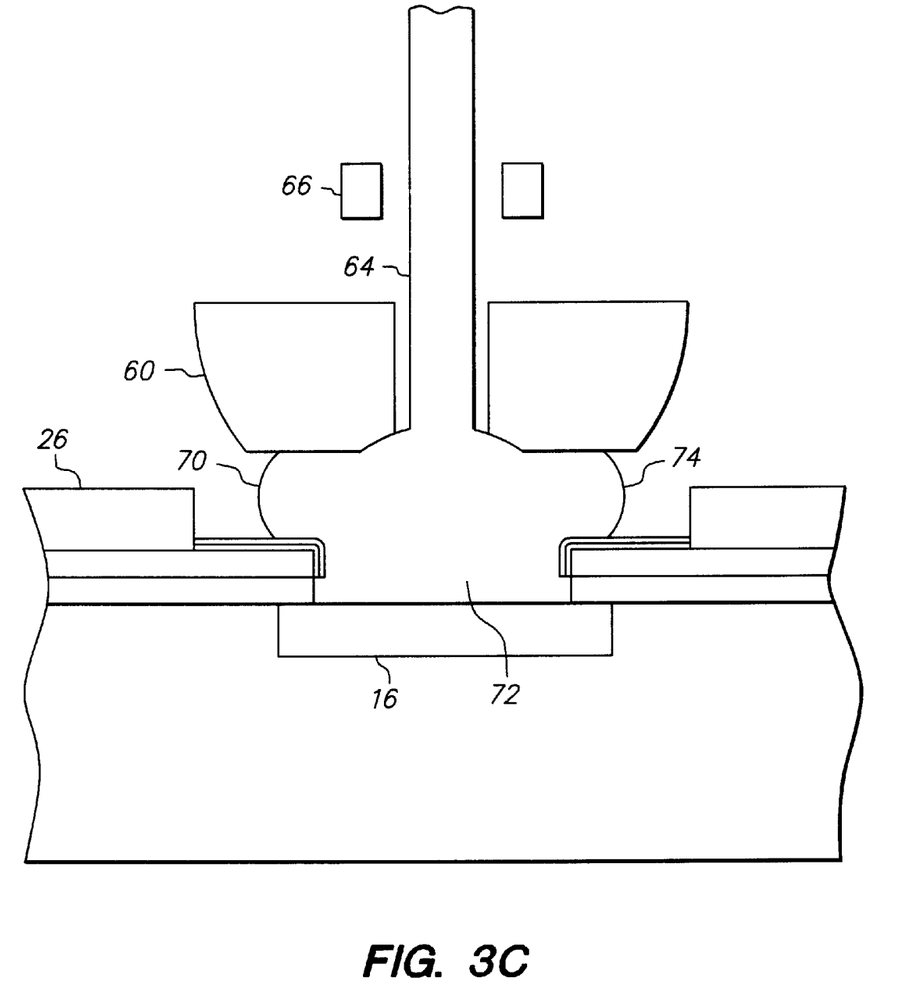

FIG. 3C shows the partially completed assembly after capillary 60 moves further downward towards pad 16 such that wire ball 62 deforms into mushroom-shaped ball bond 70 that fills openings 36 and 44 and partially fills and extends above opening 42 without contacting base 26. More particular y, since wire ball 62 is still in a soft state which is easy to deform, and capillary 60 exerts a downward force of about 25 to 45 grams while continuing to oscillate ultrasonically, wire ball 62 squeezes into openings 36 and 44 and deforms into mushroom-shaped ball bond 70 that includes stem 72 and pileus or cap 74. Stem 72 fills openings 36 and 44 and contacts pad 16 and a vertical portion of routing line 34 that surrounds opening 42. Cap 74 extends into opening 42 and contacts a portion of the top surface of routing line 34 that is adjacent to opening 36 without contacting base 26. Clamp 66 remains open so that wire 64 continues to unwind from its spool as capillary 60 moves. Furthermore, the combination of heat, pressure and ultrasonic vibration forms a gold-aluminum alloy between ball bond 70 and pad 16 and a gold-silver alloy between ball bond 70 and routing line 34. Cap 74 has a diameter of 110 microns and a height of 30 microns. Thus, cap 74 contacts a ring-shaped portion of the top surface of routing line 34 with an annular width of 20 microns ((110–70)/2), and is spaced from the sidewalls of opening 42 by 10 microns ((130–110)/2).

As mentioned above, the combined volume of openings 36 and 44 is $108 \times 10^3$ cubic microns. Therefore, stem 72 has a volume of $108 \times 10^3$ cubic microns. In accordance with equation (1) and the dimensions given above, the volume of cap 74 can be calculated as follows:

$$\text{Volume (cap 74)} = \pi (110/2 \text{ microns})^2 (30 \text{ microns}) = 285 \times 10^3 \text{ cubic microns} \quad (7)$$

Therefore, the volume of ball bond 70 is the combined volume of stem 72 and cap 74 which is $393 \times 10^3$ cubic microns.

As mentioned above, wire ball 62 has a substantially spherical shape with a diameter of 90 microns. Therefore, the volume of wire ball 62 can be calculated in accordance with equation (4) as follows:

$$\text{Volume (wire ball 62)} = (4/3)\pi (90/2 \text{ microns})^3 = 382 \times 10^3 \text{ cubic microns} \quad (8)$$

Thus, the sizes of wire ball 62 and ball bond 70 are comparable and the slight difference between the calculated volumes can be attributed to inaccuracies arising from actual shapes that are not perfect cylinders or spheres. Furthermore, the slight difference between the calculated volumes is not considered significant, for instance, it would not matter if the diameter or height of cap 74 varied by a few microns.

Figure 3D:
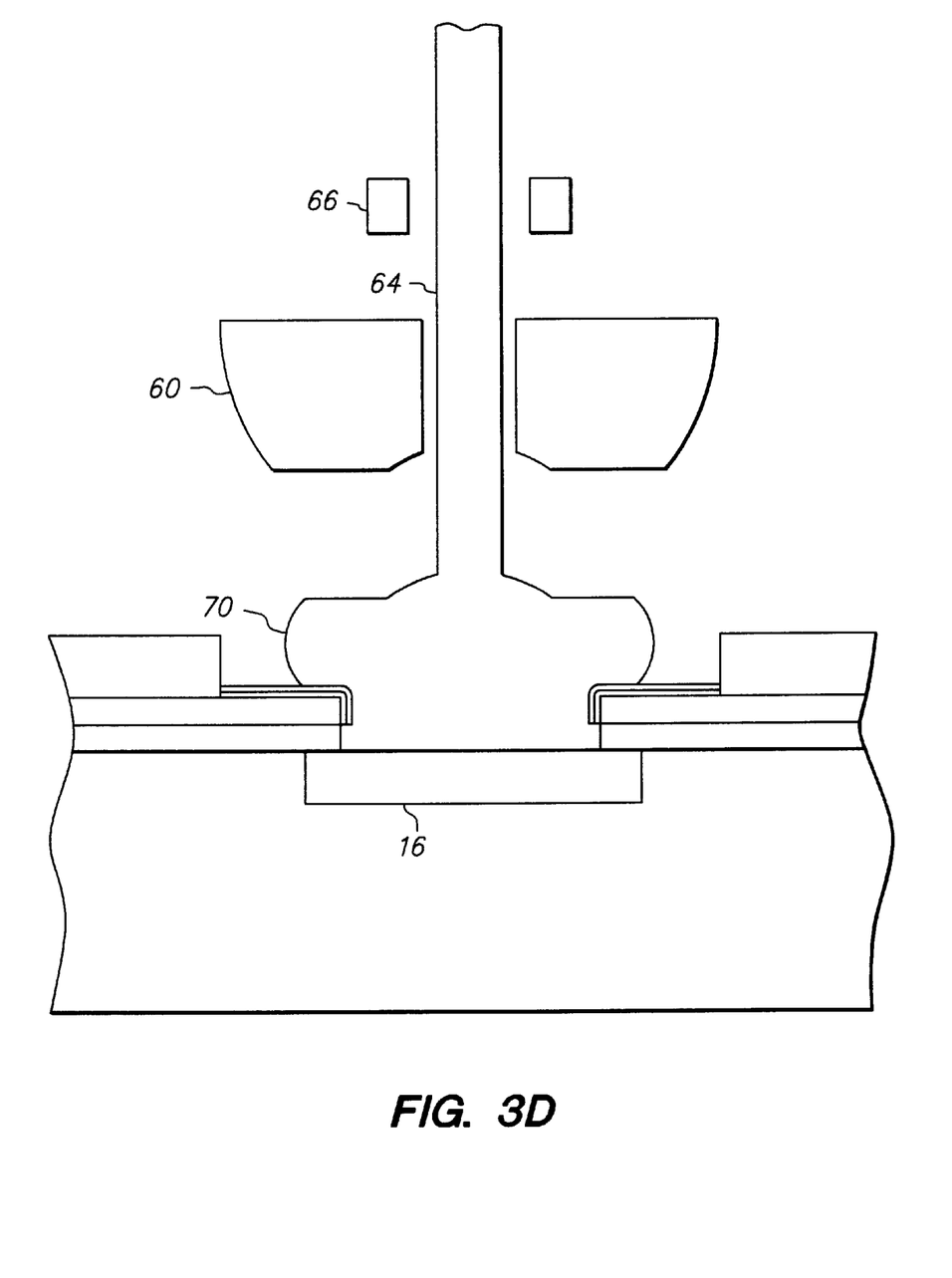

FIG. 3D shows the partially completed assembly after capillary 60 moves upward away from pad 16 and mushroom-shaped ball bond 70 while clamp 66 remains open and wire 64 slides through capillary 60 without exerting upward pressure on ball bond 70. In addition, ball bond 70 begins to cool and solidify.

Figure 3E:
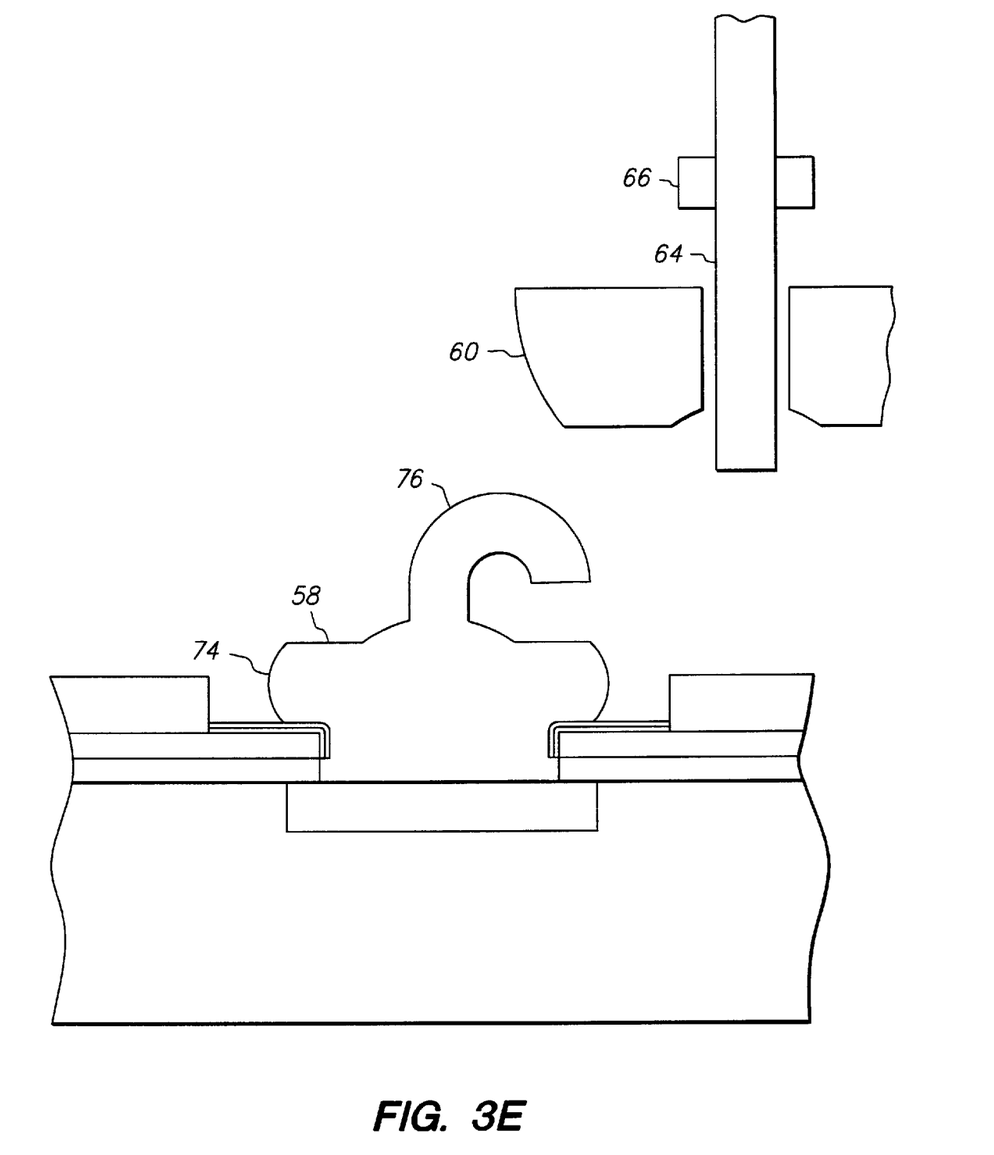

FIG. 3E shows the completed assembly after ball bond 70 solidifies to form ball bond connection joint 58, clamp 66 closes, and capillary 60 moves in a horizontal loop and then downward with a force of 70 to 90 grams in order to cut wire 64 at its edge in proximity to cap 74 thereby disconnecting wire 64 from ball bond connection joint 58. As a result, ball bond connection joint 58 has a mushroom-shape with an inconsequential inverted U-shaped tail 76 that extends 50 microns above cap 74. Of importance, ball bond connection joint 58 forms an alloyed metallic bond to pad 16 and routing line 34 at essentially the same time.

The semiconductor chip assembly described above is merely exemplary. Numerous other embodiments are contemplated. For instance, the support circuit can be single or multi-layer printed circuit board, a lead frame, a tape, a glass panel, or a ceramic hybrid.

The conductive trace can have various shapes and sizes and can be various conductive metals including copper, gold, nickel, aluminum, tin, combinations thereof, and alloys thereof. Of common metallic materials, copper has especially low resistivity and cost. Furthermore, those skilled in the art will understand that in the context of a support circuit, a copper conductive trace is typically a copper alloy that is mostly copper but not pure elemental copper, such copper-zirconium (99.9% copper), copper-silver-phosphorus-magnesium (99.7% copper), or copper-tin-iron-phosphorus (99.7% copper). The conductive trace may be compatible with receiving the ball bond connection joint before the openings or the through-hole are formed, thereby obviating the need for the spot plated metal, depending on the materials and processes used. The conductive trace may function as a signal, power or ground layer depending on the purpose of the associated chip pad. The conductive trace need not necessarily extend above the top surface of the base or below the bottom surface of the base. Furthermore, the top portion of the conductive trace can be a ball, a pad, or a pillar (columnar post). A pillar is particularly well-suited for reducing thermal mismatch related stress in the next level assembly.

The pad can have numerous shapes including a flat rectangular shape and a bumped shape. For instance, a bump-shaped pad may extend into the through-hole and may even extend above the routing line. The pad can either be partially or completely exposed by the through-hole prior to forming the ball bond connection joint. The pad can have a length and width that are larger than, equal to, or smaller than the diameter of the through-hole. Preferably, the pad and through-hole have the same or similar size, and essentially all of the pad is directly beneath the through-hole.

The pillar and through-hole can have a circular, square, rectangular or other shape (as viewed from the top surface of the support circuit). Furthermore, the pillar and through-hole can have sidewalls with a wide variety of shapes and slopes including vertical sidewalls, tapered sidewalls, continuous sidewalls and stepped sidewalls.

The through-hole may be formed completely or partially either before or after mechanically attaching the chip to the support circuit. Likewise, the opening in the routing line may be formed either before or after forming the opening in the base. See, for instance, U.S. application Ser. No. 09/643,445, filed Aug. 22, 2000 by Charles W. C. Lin entitled "Method of Making a Semiconductor Chip Assembly" which is incorporated by reference.

The insulative base may be rigid or flexible, and may be formed from numerous organic or inorganic insulators such as tape (polyimide), epoxy, silicone, glass (aramid) and ceramic. Organic insulators are preferred for low cost, high dielectric applications, whereas inorganic insulators are preferred when high thermal dissipation and a matched thermal coefficient of expansion are important.

Numerous adhesives can be used between the chip and the support circuit. For instance, the adhesive can be applied as a paste, a laminated layer, or a liquid applied by screen-printing, spin-on, or spray-on. If a paste or liquid adhesive is applied, the adhesive may contact the base and fill the opening in the routing line, although the laser etch would remove adhesive in the opening in the routing line. If a laminated adhesive is applied then no appreciable amount of adhesive may contact the base or reside inside the opening in the routing line. Likewise, the opening in the adhesive that forms the bottom of the through-hole may be formed either before or after mechanically attaching the chip to the support circuit. Thermosetting adhesive liquids and pastes are generally suitable if they need not be exposed to an electrolytic plating bath. For instance, the adhesive can be applied as a liquid or paste (A stage) to the bottom surface of the support circuit, the adhesive can be partially cured (B stage), an etch can form the opening in the adhesive, the partially cured adhesive can be brought into contact with the chip, thereby exposing the pad through the through-hole, and then the adhesive can be fully cured (C stage). Alternatively, the liquid or paste adhesive can be sandwiched between the chip and the support circuit, the adhesive can be fully cured thereby mechanically fastening the chip to the support circuit, and then the etch can form the opening in the adhesive thereby exposing the pad through the through-hole.

The ball bond connection joint may be formed by thermocompression or thermosonic wire bonding and composed of any conventional bonding wire material including gold, silver, copper, palladium, and alloys thereof. For instance, gold alloyed with a small amount of beryllium exhibits grain growth at low temperature which enhances stability and increases strength by precipitation hardening. Gold alloyed with 5 to 10 ppm beryllium by weight or 30 to 100 ppm copper by weight is commonly used for thermocompression and thermosonic wire bonding. Similarly, gold alloyed with 1 percent palladium raises the recrystallization temperature so that the fully annealed area above the ball bond resulting from the thermal source (such as electronic flame-off), called the heat-affected zone (HAZ), is extremely short, resulting in a short tail or stump on the ball bond after the wire is broken from the ball bond with a simple upward vertical movement. Furthermore, aluminum alloyed with small amounts of silicon, magnesium or both has been proposed for thermosonic wire bonding.

The ball bond connection joint may be formed by initially contacting the wire ball to the pad, the routing line, or both, depending on the relative dimensions of the wire ball and the openings. Likewise, the diameter of the wire ball may be larger, smaller, or equal to the diameter of the opening in the routing line. If, for instance, the diameter of the wire ball is smaller than the diameter of the opening in the routing line and the wire ball initially contacts the pad without contacting the routing line, then it may be desirable to move the capillary in a horizontal loop to assure that the ball bond contacts the routing line and fills the opening in the routing line. Furthermore, the capillary can be withdrawn (clamp open) and then reapplied (clamp closed) to supply additional gold to the ball bond.

The ball bond connection joint may completely or partially fill the openings in the adhesive and the routing line. It is generally preferred that the ball bond connection joint completely fill these openings in order to maximize the contact area with the routing line and the pad. However, if the wire ball seals the opening in the routing line before adequately contacting the pad, then trapped air between the wire ball and the pad may create a compressive force that prevents the wire ball from adequately contacting the pad. Trapped air can be reduced or eliminated by proper choice of shapes and dimensions. For example, if the opening in the routing line has sidewalls that taper at an angle of 45 degrees such that the diameter increases with increasing height, the opening in the adhesive has the same diameter as the bottom of the opening in the routing line, and the wire ball contacts the pad before contacting the routing line, then little or no trapped air should occur. See, for instance, U.S. application Ser. No. 09/665,931, filed Sep. 20, 2000 by Charles W. C. Lin entitled "Method of Making a Support Circuit with a Tapered Through-Hole for a Semiconductor Chip Assembly" which is incorporated by reference.

The ball bond connection joint may completely or partially fill the opening in the base, may extend over the base, or may not occupy any space in the opening in the base. For instance, if the bottom surface of the capillary fits within the opening in the base, then the capillary may extend into the opening in the base as the wire ball is being deformed.

After the ball bond connection joint is formed, the tail can be reduced or eliminated. For instance, the tail can be flattened or "coined" using a secondary operation after cutting the wire. Alternatively, before moving or after slightly moving the capillary vertically upwards and away from the ball bond, the clamp can be closed and then the capillary can be moved horizontally to shear the wire from the ball bond at or near their juncture. This shearing operation requires that the capillary have adequate clearance for the horizontal motion, which will depend on the dimensions and shapes of the capillary, the ball bond and the opening in the base, as well as the amount of the upward vertical movement. As another example, the wire bonding equipment may include a blade that creates a notch in the wire to provide a weak point that subsequently breaks.

After the ball bond connection joint is formed, further encapsulation can be performed but is generally not necessary. In particular, it is not necessary to fill a conductor or insulator into whatever space remains in the through-hole or deposit an insulator over the base. However, in the event the base is thin, it may be desirable to provide an encapsulant to enhance the mechanical strength of the support circuit.

After the ball bond connection joint is formed, a soldering material or solder ball can be deposited over the pillar by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

After the ball bond connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, then prior to singulation a photolithography step can be added to selectively cut related circuitry on the assembly that is dedicated to the plating bus since this circuitry would otherwise short the conductive traces together.

The working format can be a single chip, a wafer, a strip or a panel based on the manufacturing design. For instance, when the working format is a wafer, numerous semiconductor chip assemblies can be simultaneously batch manufactured on a single wafer and then separated from one another into chip size packages during singulation. As another example, when the working format is a strip (or reel-to-reel) form of the support circuit, the wafer is singulated into individual chips, the chips are individually attached to support circuits on the strip, the semiconductor chip assemblies are formed by exposing the pads using the throuth-holes and forming the connection joints, and then the assemblies are separated from one another by cutting the strip. Assemblies manufactured using a strip can be chip size packages, ball grid arrays, or other structures. The wafer-based approach employs fewer steps and is less time consuming than the strip-based approach, however the strip-based approach is easier to control and has better dimensional stability than the wafer-based approach since aligning the through-holes with the pads involves a single chip and a single support circuit rather than the entire wafer and numerous support circuits.

Advantageously, the present invention provides a semiconductor chip assembly that is reliable and inexpensive. Conventional wire bonding equipment that is commonly used for many other packaging production steps can form the ball bond connection joint. This leverages the use of existing wire bonding equipment and eliminates the need for special equipment. The mode of the connection shifts from the initial mechanical coupling to metallurgical coupling to assure sufficient metallurgical bond strength. The ball bond connection joint can be laterally confined to the through-hole without extending above the pillar. The pillar yields enhanced reliability for the next level assembly that exceeds that of conventional BGA packages. Furthermore, mechanical and metallurgical coupling between the chip and the support circuit can be provided without TAB, flip-chip bonding, polishing, photolithography, or solder joints. As a result, the assembly of the present invention significantly enhances throughput, yield and performance characteristics compared to conventional packaging techniques. Moreover, the assembly of the present invention is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of manufacturing a semiconductor chip assembly, comprising:

providing a semiconductor chip and a support circuit, wherein the semiconductor chip includes a conductive pad, and the support circuit includes an insulative base, a conductive trace and a through-hole that extends through the conductive trace and exposes the pad; and then forming a ball bond in the through-hole that contacts and electrically connects the conductive trace and the pad.

2. The method of claim 1, wherein forming the ball bond includes applying thermocompression wire bonding.

3. The method of claim 1, wherein forming the ball bond includes applying thermosonic wire bonding.

4. The method of claim 1, wherein the conductive trace includes a pillar and a routing line, the pillar extends above the base and the routing line and is spaced from the through-hole, the routing line extends below the base, and the through-hole extends through the routing line.

5. The method of claim 4, wherein the through-hole extends through the base.

6. The method of claim 5, wherein the through-hole extends through an adhesive that is between and in contact with the chip and the support circuit.

7. The method of claim 6, wherein the through-hole consists of openings in the base, the routing line and the adhesive.

8. The method of claim 1, wherein the ball bond substantially fills the through-hole.

9. The method of claim 1, wherein the conductive trace and the ball bond provide all horizontal and vertical routing between a top surface of the support circuit and the pad.

10. The method of claim 1, wherein the assembly is a chip size package.

11. A method of manufacturing a semiconductor chip assembly, comprising:

providing a semiconductor chip with upper and lower surfaces, wherein the upper surface includes a conductive pad;

providing a support circuit with top and bottom surfaces, wherein the support circuit includes an insulative base and a conductive trace within the base, the conductive trace includes a pillar and a routing line, and the pillar extends above the base and the routing line to the top surface;

providing an adhesive between the upper surface and the bottom surface, thereby mechanically attaching the chip to the support circuit;

providing a through-hole that extends through the base, the routing line and the adhesive, thereby exposing the pad; and then forming a ball bond in the through-hole using thermocompression or thermosonic wire bonding, wherein the ball bond provides a connection joint that contacts and electrically connects the routing line and the pad.

12. The method of claim 11, wherein the ball bond consists of a deformed wire ball.

13. The method of claim 11, wherein the ball bond does not contact the base.

14. The method of claim 11, wherein the ball bond contacts all of a contact portion of the routing line that spans 360 degrees around the through-hole.

15. The method of claim 11, wherein the ball bond has a mushroom-shape.

16. The method of claim 11, wherein the conductive trace and the ball bond provide all horizontal and vertical routing between the top surface and the pad.

17. The method of claim 11, wherein the pad is aligned with the through-hole such that a central region of the pad is exposed by the through-hole and a peripheral region of the pad is not exposed by the through-hole before forming the ball bond, and the ball bond contacts the central region without contacting the peripheral region.

18. The method of claim 11, wherein the conductive trace is primarily copper, the base is an insulator selected from the group consisting of tape, epoxy, silicone, glass and ceramic, and the ball bond is primarily gold.

19. The method of claim 11, wherein the assembly is devoid of TAB leads and solder joints.

20. The method of claim 11, wherein the assembly is a chip size package.

21. A method of manufacturing a semiconductor chip assembly, comprising the following steps in the sequence set forth:

disposing an insulative adhesive between a chip and a support circuit, thereby mechanically attaching the chip to the support circuit, wherein the chip includes a pad, the support circuit includes an insulative base and a conductive trace, the conductive trace includes a pillar and a routing line, the pillar extends above the base and the routing line, a through-hole extends through an opening in the base, an opening in the routing line and an opening in the adhesive, the through-hole exposes a contact region of the routing line, and the through-hole exposes the pad;

positioning a capillary with a wire ball extending therefrom over the through-hole, wherein the wire ball is connected to a wire that is fed through the capillary;

moving the capillary towards the through-hole so that the wire ball enters the through-hole and contacts the contact region of the routing line and the pad;

moving the capillary further towards the through-hole so that the wire ball deforms into a ball bond that substantially fills the opening in the adhesive and remains connected to the wire; and moving the capillary away from the through-hole, disconnecting the ball bond from the wire, and cooling the ball bond so that the ball bond forms a ball bond connection joint that is inside the through-hole and contacts and electrically connects the contact region of the routing line and the pad.

22. The method of claim 21, wherein the capillary forms the ball bond using thermocompression wire bonding.

23. The method of claim 21, wherein the capillary forms the ball bond using thermosonic wire bonding.

24. The method of claim 21, wherein the wire ball contacts the pad and then contacts the contact region of the routing line.

25. The method of claim 21, wherein the wire ball contacts the contact region of the routing line and then the pad.

26. The method of claim 21, wherein the wire ball deforms into a shape that fills the opening in the adhesive and the opening in the routing line.

27. The method of claim 21, wherein the ball bond connection joint has a mushroom-shape that includes a stem and a cap, the stem contacts the contact region of the routing line and the pad and fills the openings in the routing line and the adhesive, and the cap contacts the contact region of the routing line and extends into the opening in the base.

28. The method of claim 21, wherein the ball bond connection joint does not contact the base.

29. The method of claim 21, including moving the capillary in a horizontal loop to form the ball bond connection joint.

30. The method of claim 21, including opening a clamp that releases the wire as the capillary is moved towards and away from the through-hole, and closing the clamp thereby holding the wire as the ball bond connection joint is disconnected from the wire.

31. A method of manufacturing a semiconductor chip assembly, comprising the following steps in the sequence set forth:

disposing an insulative adhesive between a chip and a support circuit, thereby mechanically attaching the chip to the support circuit, wherein the chip includes a pad, the support circuit includes an insulative base and a conductive trace, the conductive trace includes a pillar and a routing line, the pillar extends above the base and the routing line, a through-hole includes an opening in the base, an opening in the routing line and an opening in the adhesive, and the through-hole exposes the pad; and applying thermocompression or thermosonic wire bonding using a capillary that inserts a wire ball into the through-hole and presses the wire ball against the routing line and the pad to form a ball bond inside the through-hole that contacts and bonds to the routing line and the pad, thereby providing a connection joint that electrically connects the routing line and the pad.

32. The method of claim 31, wherein the routing line provides horizontal routing between the pillar and the pad, and the pillar and the connection joint provide vertical routing between a top surface of the support circuit and the pad.

33. The method of claim 31, wherein the routing line extends below the base.

34. The method of claim 31, wherein the adhesive contacts the routing line without contacting the base.

35. The method of claim 31, wherein the adhesive contacts the routing line and the base.

36. The method of claim 31, including forming the opening in the throuth-hole before forming the openings in the base and the adhesive.

37. The method of claim 31, including forming the opening in the adhesive before mechanically attaching the chip to the support circuit.

38. The method of claim 31, wherein the openings in the base, the routing line and the adhesive are aligned with one another and have substantially similar diameters.

39. The method of claim 31, wherein the opening in the base has a larger diameter than that of the opening in the routing line and the opening in the adhesive.

40. The method of claim 31, wherein a top sidewall portion of the opening in the base remains exposed and devoid of metal after forming the connection joint.

41. The method of claim 31, wherein the connection joint contacts a top surface of the routing line adjacent to the opening in the routing line and a sidewall portion of the routing line that surrounds the opening in the routing line.

42. The method of claim 31, wherein the connection joint extends above the base.

43. The method of claim 31, wherein the connection joint consists of the wire ball as deformed by the capillary after the capillary presses the wire ball against the routing line and the pad to form the ball bond and a portion of a wire that extends above the ball bond and does not contact any conductor except for the ball bond.

44. The method of claim 31, wherein the connection joint does not contact the base.

45. The method of claim 31, wherein the connection joint only contacts the routing line, the pad and the adhesive.

46. The method of claim 31, wherein the pad includes a central region directly beneath the opening in the adhesive and a peripheral region covered by the adhesive, and the connection joint contacts the central region without contacting the peripheral region.

47. The method of claim 31, wherein the pillar is formed subtractively.

48. The method of claim 31, wherein the pillar has a diameter that is narrowest at its top surface.

49. The method of claim 31, wherein the pillar has a continuous taper between its top surface and the base.

50. The method of claim 31, wherein the pillar has a continuous taper between its top surface and the routing line.

51. The method of claim 31, wherein the pillar has a flat top surface.

52. The method of claim 31, wherein the pillar extends a first distance above the routing line, the base extends a second distance above the routing line, and the first distance is at least twice the second distance.

53. The method of claim 31, wherein the pillar extends at least 100 microns above the base.

54. The method of claim 31, wherein the conductive trace is a metal selected from the group consisting of copper, gold, nickel, palladium, tin, combinations thereof, and alloys thereof.

55. The method of claim 31, wherein the base is an insulator selected from the group consisting of tape, epoxy, silicone, glass and ceramic.

56. The method of claim 31, wherein the connection joint is essentially gold.

57. The method of claim 31, wherein the method excludes polishing.

58. The method of claim 31, wherein the assembly is devoid of TAB leads.

59. The method of claim 31, wherein the assembly is devoid of TAB leads and solder joints.

60. The method of claim 31, wherein the assembly is a chip size package.

* * * * *